US011359865B2

(12) United States Patent
Stone et al.

(10) Patent No.: US 11,359,865 B2
(45) Date of Patent: Jun. 14, 2022

(54) DUAL COOLING TOWER TIME SHARE WATER TREATMENT SYSTEM

(71) Applicant: Green Revolution Cooling, Inc., Austin, TX (US)

(72) Inventors: Larry Stone, Austin, TX (US); Alex McManis, Austin, TX (US); Jason Mayo, Austin, TX (US); Ron Slezak, Austin, TX (US)

(73) Assignee: Green Revolution Cooling, Inc., Austin, TX (US)

( * ) Notice: Subject to any disclaimer, the term of this patent is extended or adjusted under 35 U.S.C. 154(b) by 89 days.

(21) Appl. No.: 16/518,871

(22) Filed: Jul. 22, 2019

(65) Prior Publication Data

US 2020/0025451 A1 Jan. 23, 2020

Related U.S. Application Data

(60) Provisional application No. 62/702,067, filed on Jul. 23, 2018.

(51) Int. Cl.
*F28D 5/02* (2006.01)
*F28F 19/00* (2006.01)
*H05K 7/20* (2006.01)

(52) U.S. Cl.
CPC ............... *F28D 5/02* (2013.01); *F28F 19/00* (2013.01); *H05K 7/20272* (2013.01); *H05K 7/20281* (2013.01); *H05K 7/20781* (2013.01)

(58) Field of Classification Search
CPC ............ F28F 19/00; F28D 2021/0028; H05K 7/20236; H05K 7/20272; H05K 7/20281;
(Continued)

(56) References Cited

U.S. PATENT DOCUMENTS 3,094,133 A * 6/1963 Treanor .................. C02F 1/688
 137/101.11
3,320,762 A * 5/1967 Murdoch ................. F24F 5/00
 62/183

(Continued)

FOREIGN PATENT DOCUMENTS

CN 101443724 A 5/2009
JP 2004319628 11/2004
(Continued)

OTHER PUBLICATIONS

Canadian Office Action dated Nov. 8, 2016 for Canadian Patent Application No. 2,731,994 related to National Phase of Application No. PCT/US2009/053305 filed Aug. 10, 2009. 4 pages.

(Continued)

*Primary Examiner* — Paul Alvare
*Assistant Examiner* — Jose O Class-Quinones
(74) *Attorney, Agent, or Firm* — The Marbury Law Group, PLLC

(57) ABSTRACT

A method of operating a cooling system including at least two water cooling circuits, an analyzer/controller configured to analyze water in the at least two water cooling circuits and solenoid valves operably connected to the at least two water cooling circuits. The method comprising opening solenoid valves associated with a first water cooling circuit of the at least two water cooling circuits to allow cooling water to flow to the analyzer/controller, detecting if the cooling water comprises one or more impurities above one or more predetermined thresholds and treating the cooling water if the analyzer/cooler detects one or more impurities in the cooling water above one or more predetermined thresholds.

16 Claims, 6 Drawing Sheets

US 11,359,865 B2

Page 2

(58) Field of Classification Search
CPC .............. H05K 7/203; H05K 7/20327; H05K 7/20627; H05K 7/20645; H05K 7/20654; H05K 7/20781; H05K 7/2079; H01L 23/473; H01L 23/44
See application file for complete search history.

(56) References Cited

U.S. PATENT DOCUMENTS

| | | | |
|---|---|---|---|
| 3,406,244 A | 10/1968 | Oktay | |
| 3,450,265 A * | 6/1969 | Kreusch | F28F 25/02 210/140 |
| 3,600,636 A | 8/1971 | Petersen | |
| 3,754,741 A * | 8/1973 | Whitehurst | F28F 25/00 261/151 |
| 3,858,090 A | 12/1974 | Lehmann | |
| 4,245,668 A | 1/1981 | Lindstrom | |
| 4,302,793 A | 11/1981 | Rohner | |
| 4,313,310 A * | 2/1982 | Kobayashi | F24F 1/00 62/175 |
| 4,399,501 A | 8/1983 | Masselin | |
| 4,460,008 A * | 7/1984 | O'Leary | G01N 27/06 137/5 |
| 4,464,315 A * | 8/1984 | O'Leary | C02F 1/008 261/110 |
| 4,590,538 A | 5/1986 | Cray, Jr. | |
| 4,648,043 A * | 3/1987 | O'Leary | B01F 15/00227 137/93 |
| 4,659,459 A * | 4/1987 | O'Leary | B01J 4/008 210/143 |
| 4,834,257 A | 5/1989 | Book et al. | |
| 5,102,503 A * | 4/1992 | Silinski | C02F 1/048 202/83 |
| 5,145,585 A * | 9/1992 | Coke | C02F 1/385 210/695 |
| 5,260,850 A | 11/1993 | Sherwood et al. | |
| 5,294,916 A * | 3/1994 | Bolton | B01D 1/0082 137/392 |
| 5,297,621 A | 3/1994 | Taraci et al. | |
| 5,329,418 A | 7/1994 | Tanabe | |
| 5,332,494 A * | 7/1994 | Eden | C02F 1/008 204/433 |
| 5,414,591 A | 5/1995 | Kimura et al. | |
| 5,574,627 A | 11/1996 | Porter | |
| 5,851,143 A | 12/1998 | Hamid | |
| 6,019,167 A | 2/2000 | Bishop et al. | |
| 6,374,627 B1 | 4/2002 | Schumacher et al. | |
| 6,600,656 B1 | 7/2003 | Mori et al. | |
| 6,616,851 B1 * | 9/2003 | Sforza-Heinen | C02F 1/685 210/167.32 |
| 6,621,707 B2 | 9/2003 | Ishimine et al. | |
| 6,909,606 B2 | 6/2005 | Barsun et al. | |
| 7,086,247 B2 | 8/2006 | Campbell et al. | |
| 7,184,269 B2 | 2/2007 | Campbell et al. | |
| 7,210,304 B2 | 5/2007 | Nagashima et al. | |
| 7,278,273 B1 | 10/2007 | Whitted et al. | |
| 7,307,841 B2 | 12/2007 | Berlin et al. | |
| 7,318,322 B2 | 1/2008 | Ota et al. | |
| 7,403,392 B2 | 7/2008 | Attlesey et al. | |
| 7,413,394 B2 | 8/2008 | Risser | |
| 7,511,959 B2 * | 3/2009 | Belady | G06F 1/18 165/104.33 |
| 7,511,960 B2 * | 3/2009 | Hillis | G06F 1/20 165/80.4 |
| 7,551,971 B2 * | 6/2009 | Hillis | H05K 7/1497 267/140.11 |
| 7,609,518 B2 | 10/2009 | Hopton et al. | |
| 7,686,175 B2 | 3/2010 | Waisanen | |
| 7,724,513 B2 * | 5/2010 | Coglitore | H05K 7/1497 361/679.47 |
| 7,724,517 B2 | 5/2010 | Attlesey et al. | |
| 7,757,506 B2 | 7/2010 | Ellsworth, Jr. et al. | |
| 7,843,298 B2 | 11/2010 | Hosokawa et al. | |
| 7,854,652 B2 * | 12/2010 | Yates | F16F 7/14 454/184 |
| 7,856,838 B2 * | 12/2010 | Hillis | H01L 23/467 62/259.2 |
| 7,905,106 B2 | 3/2011 | Attlesey | |
| 7,911,782 B2 | 3/2011 | Attlesey et al. | |
| 7,911,793 B2 | 3/2011 | Attlesey | |
| 7,934,386 B2 | 5/2011 | Rummel et al. | |
| 7,961,463 B2 * | 6/2011 | Belady | H05K 7/20745 361/695 |
| 7,983,040 B2 | 7/2011 | Campbell et al. | |
| 8,009,419 B2 | 8/2011 | Attlesey et al. | |
| 8,047,904 B2 * | 11/2011 | Yates | H05K 7/1497 454/118 |
| 8,213,261 B2 | 7/2012 | Imhof et al. | |
| 8,295,047 B1 * | 10/2012 | Hamburgen | H05K 7/20827 361/699 |
| 8,310,829 B2 | 11/2012 | Monk et al. | |
| 8,654,529 B2 | 2/2014 | Attlesey | |
| 8,817,465 B2 | 8/2014 | Campbell et al. | |
| 9,049,800 B2 | 6/2015 | Shelnutt et al. | |
| 10,123,463 B2 | 11/2018 | Best et al. | |
| 10,306,804 B2 | 5/2019 | Chester et al. | |
| 10,405,457 B2 | 9/2019 | Boyd et al. | |
| 10,743,438 B2 | 8/2020 | Wakino et al. | |
| 10,820,446 B2 | 10/2020 | Boyd et al. | |
| 2002/0014460 A1 * | 2/2002 | McKay | C02F 1/4606 210/696 |
| 2002/0151799 A1 | 10/2002 | Pantages et al. | |
| 2002/0185262 A1 | 12/2002 | Baer | |
| 2002/0189173 A1 * | 12/2002 | Staschik | C02F 9/00 52/79.1 |
| 2003/0053293 A1 | 3/2003 | Beitelmal et al. | |
| 2003/0127240 A1 | 7/2003 | Beckbissinger et al. | |
| 2004/0008490 A1 | 1/2004 | Cheon | |
| 2004/0013563 A1 * | 1/2004 | Romer | F24F 8/10 422/28 |
| 2004/0050491 A1 | 3/2004 | Miya et al. | |
| 2004/0223300 A1 | 11/2004 | Fink et al. | |
| 2004/0246683 A1 | 12/2004 | Honsberg-Riedl et al. | |
| 2004/0254682 A1 * | 12/2004 | Kast | C02F 3/1294 700/265 |
| 2005/0011839 A1 * | 1/2005 | Dart | C02F 1/505 210/764 |
| 2005/0024826 A1 | 2/2005 | Bash et al. | |
| 2005/0052847 A1 | 3/2005 | Hamman | |
| 2005/0083657 A1 | 4/2005 | Hamman | |
| 2005/0111184 A1 | 5/2005 | Cliff et al. | |
| 2005/0114876 A1 | 5/2005 | Atarashi et al. | |
| 2005/0152112 A1 | 7/2005 | Holmes et al. | |
| 2005/0259402 A1 | 11/2005 | Yasui et al. | |
| 2006/0026610 A1 | 2/2006 | Sasao et al. | |
| 2006/0064970 A1 | 3/2006 | Throckmorton et al. | |
| 2006/0123436 A1 | 6/2006 | Tanaka et al. | |
| 2006/0135042 A1 | 6/2006 | Frost et al. | |
| 2006/0250755 A1 | 11/2006 | Tilton et al. | |
| 2006/0274501 A1 | 12/2006 | Miller | |
| 2007/0006599 A1 | 1/2007 | Kawamura et al. | |
| 2007/0025081 A1 | 2/2007 | Berlin et al. | |
| 2007/0034360 A1 | 2/2007 | Hall | |
| 2007/0199340 A1 | 8/2007 | Knight et al. | |
| 2007/0213000 A1 | 9/2007 | Day | |
| 2007/0227710 A1 | 10/2007 | Belady et al. | |
| 2007/0267741 A1 | 11/2007 | Attlesey et al. | |
| 2008/0002364 A1 | 1/2008 | Campbell et al. | |
| 2008/0017355 A1 | 1/2008 | Campbell et al. | |
| 2008/0026509 A1 | 1/2008 | Campbell et al. | |
| 2008/0029250 A1 | 2/2008 | Carlson | |
| 2008/0030945 A1 | 2/2008 | Mojaver et al. | |
| 2008/0055845 A1 | 3/2008 | Murakami et al. | |
| 2008/0158818 A1 | 7/2008 | Clidaras et al. | |
| 2008/0174954 A1 | 7/2008 | VanGilder et al. | |
| 2008/0180908 A1 | 7/2008 | Wexler | |
| 2008/0196868 A1 | 8/2008 | Attlesey et al. | |
| 2008/0196870 A1 | 8/2008 | Attlesey et al. | |
| 2008/0209931 A1 | 9/2008 | Stevens | |
| 2008/0273306 A1 | 11/2008 | Campbell et al. | |
| 2009/0168345 A1 | 7/2009 | Martini | |
| 2009/0229194 A1 | 9/2009 | Armillas | |
| 2009/0251860 A1 | 10/2009 | Belady et al. | |

(56) References Cited

U.S. PATENT DOCUMENTS

| | | |
|---|---|---|
| 2009/0260777 A1 | 10/2009 | Attlesey |
| 2009/0262455 A1 | 10/2009 | Merrow |
| 2009/0295167 A1* | 12/2009 | Clidaras .............. F28D 15/00 290/55 |
| 2010/0027212 A1 | 2/2010 | Armillas |
| 2010/0061057 A1 | 3/2010 | Dersch et al. |
| 2010/0103618 A1 | 4/2010 | Campbell et al. |
| 2010/0139887 A1* | 6/2010 | Slessman .......... H05K 7/20763 165/67 |
| 2010/0165565 A1* | 7/2010 | Hellriegal .......... H05K 7/20736 361/679.46 |
| 2010/0226094 A1 | 9/2010 | Attlesey et al. |
| 2010/0246118 A1 | 9/2010 | Attlesey |
| 2010/0263885 A1 | 10/2010 | Tuma |
| 2010/0275441 A1 | 11/2010 | Rasmussen et al. |
| 2010/0290190 A1 | 11/2010 | Chester et al. |
| 2010/0030267 A1 | 12/2010 | Merrow |
| 2010/0302678 A1 | 12/2010 | Merrow |
| 2011/0075353 A1 | 3/2011 | Attlesey et al. |
| 2011/0120885 A1* | 5/2011 | Miller .................. C02F 1/46104 205/743 |
| 2011/0132579 A1 | 6/2011 | Best et al. |
| 2011/0134604 A1 | 6/2011 | Attlesey |
| 2011/0151765 A1* | 6/2011 | Chen .................. H05K 7/20745 454/184 |
| 2011/0157829 A1* | 6/2011 | Wormsbecher ...... H05K 7/1497 361/701 |
| 2011/0240281 A1 | 10/2011 | Avery |
| 2011/0267775 A1 | 11/2011 | Vanderveen et al. |
| 2012/0026691 A1 | 2/2012 | Campbell et al. |
| 2012/0035773 A1 | 2/2012 | Stabinski et al. |
| 2012/0123595 A1 | 5/2012 | Bower, III et al. |
| 2012/0155027 A1 | 6/2012 | Broome et al. |
| 2012/0171943 A1* | 7/2012 | Dunnavant ............. F28D 15/02 454/184 |
| 2012/0236487 A1 | 9/2012 | Wallace et al. |
| 2012/0294737 A1* | 11/2012 | Singh .................. F01K 25/08 417/410.1 |
| 2012/0300391 A1 | 11/2012 | Keisling et al. |
| 2013/0025888 A1 | 1/2013 | Eckholm et al. |
| 2013/0032217 A1 | 2/2013 | Pesek et al. |
| 2013/0075066 A1* | 3/2013 | Reytblat ................. F28C 1/08 165/121 |
| 2013/0105139 A1 | 5/2013 | Campbell et al. |
| 2013/0146273 A1 | 6/2013 | Chester et al. |
| 2014/0085817 A1 | 3/2014 | Campbell et al. |
| 2014/0085821 A1 | 3/2014 | Regimbal et al. |
| 2014/0109610 A1 | 4/2014 | Wulf et al. |
| 2014/0211412 A1 | 7/2014 | Best |
| 2014/0216686 A1 | 8/2014 | Shelnutt et al. |
| 2014/0218858 A1 | 8/2014 | Shelnutt et al. |
| 2014/0301037 A1* | 10/2014 | Best .................. H05K 7/20781 361/679.53 |
| 2014/0307384 A1* | 10/2014 | Best .................. H05K 7/1497 361/679.53 |
| 2014/0362527 A1* | 12/2014 | Best .................. H05K 7/2079 361/679.53 |
| 2015/0048950 A1* | 2/2015 | Zeighami ............ G08B 21/182 340/605 |
| 2015/0181762 A1* | 6/2015 | Boyd ................. H05K 7/20272 165/104.33 |
| 2015/0276292 A1* | 10/2015 | Son ........................ F28C 1/00 62/135 |
| 2015/0305209 A1* | 10/2015 | Inaba ..................... F28D 15/06 361/679.47 |
| 2015/0334880 A1* | 11/2015 | Best .................. H05K 7/20236 361/679.47 |
| 2016/0234970 A1 | 8/2016 | Shelnutt et al. |
| 2017/0142868 A1* | 5/2017 | Chen .................. F28D 15/0266 |
| 2017/0303443 A1* | 10/2017 | Inano ..................... G06F 1/206 |
| 2018/0020572 A1 | 1/2018 | Fujiwara et al. |
| 2018/0288906 A1 | 10/2018 | Hopton et al. |
| 2018/0368281 A1 | 12/2018 | Wang et al. |
| 2019/0090383 A1 | 3/2019 | Tufty et al. |
| 2020/0323108 A1 | 10/2020 | Bilan et al. |

FOREIGN PATENT DOCUMENTS

| | | |
|---|---|---|
| JP | 2004363308 | 12/2004 |
| WO | 2007023130 A2 | 3/2007 |
| WO | 2007098078 A2 | 8/2007 |
| WO | 2008027931 A2 | 3/2008 |
| WO | 2008089322 A2 | 7/2008 |
| WO | 2010019517 A1 | 2/2010 |
| WO | 2013022805 A1 | 2/2013 |

OTHER PUBLICATIONS

"Inetl Core 2 Duo Processor on 65 nm process for Embedded Applications", Thermal Design Guide, Aug. 2007, Intel, pp. 1, 14, and 21.

Substantive Examination Adverse Report, (section 301(1) / 30(2)). Malaysian Application No. PI 2011000494. dated May 15, 2015, 3 pages.

Non-Final Office Action in U.S. Appl. No. 14/667,091, dated May 22, 2015, 16 pages.

Patent Examination Report No. 1 from Australian Application No. 2009282170, dated Nov. 15, 2013, pp. 1-4.

Patent Examination Report No. 2 from Australian Application No. 2009282170, dated Jun. 18, 2014, pp. 1-4.

International Search Report and Written Opinion from PCT/US12/49668, dated Oct. 19, 2012, Green Revolution Cooling Inc., pp. 1-10.

Office Action from Chinese Application No. 200980131707.3, dated Dec. 31, 2014, English and Chinese versions, pp. 1-10.

Office Action from Chinese Application No. 200980131707.3, dated Apr. 3, 2014, English translation, pp. 1-13.

Office Action from Chinese Application No. 200980131707.3, dated Dec. 20, 2012, English and Chinese versions, pp. 1-17.

Office Action from Chinese Application No. 200980131707.3, dated Jul. 31, 2013, English and Chinese versions, pp. 1-8.

Office Action from Chinese Application No. 200980131707.3, dated Apr. 18, 2014, English and Chinese versions, pp. 1-7.

Office Action from Chinese Application No. 200980131707.3, dated Jul. 31, 2013, English translation, pp. 1-3.

U.S. Appl. No. 14/338,035, filed Jul. 22, 2014, Christiaan Scott Best.

U.S. Appl. No. 14/338,013, filed Jul. 22, 2014, Christiaan Scott Best.

U.S. Appl. No. 14/338,020, filed Jul. 22, 2014, Christiaan Scott Best.

U.S. Appl. No. 14/338,026, filed Jul. 22, 2014, Christiaan Scott Best.

U.S. Appl. No. 14/667,091, filed Mar. 24, 2015, Christiaan Scott Best.

International Search Report and Written Opinion dated Oct. 14, 2009, Application No. PCT/US2009/053305, 10 pages.

Singapore Written Opinion and Search Report dated May 2, 2012, Application No. 201100595-6, 21 pages.

Examination Report, Communication pursuant to Article 94(3) EPC, dated Nov. 26, 2018, for European Patent Application No. 09807136.8 from the European Patent Office, 13 pages.

Rich Miller, "Data Center Used to Heat Swimming Pool" dated Apr. 2, 2008, DataCenter Knowledge, URL: "https://www.datacenterknowledge.com/archives/2008/04/02/data-center-used-to-heat-swimming-pool", 2 pages.

"Green Revolution Cooling Named Disruptive at SC09," Press Release, Aug. 3, 2009, Austin, TX (1 page).

Canadian Intellectual Property Office, Office Action dated Nov. 8, 2016, for Canadian Patent Application No. 2,731,994 related to National Phase of Application No. PCT/US2009/053305 filed Aug. 10, 2009. (4 Pages).

"Disruptive Technologies", Super Computing, Nov. 14-20, 2009, Oregon Convention Center, Portland, Oregon (2 pages).

(56) References Cited

OTHER PUBLICATIONS

Hernandez, "Are Liquid-Cooled Servers Coming to a Data Center Near you?", Clean Tech, Dec. 4, 2009 (2 pages).
"Green Revolution Cooling Named a Disruptive Technology of the Year at SC10," Press Release, Nov. 1, 2010, New Orleans, LA (1 page).
Markoff, "Data Centers' Power Use Less Than was Expected," The New York Times, Jul. 31, 2011, (3 pages).
Danish Patent and Trademark Office Singapore, Written Opinion and Search Report for Application No. 201100595-6, dated Apr. 16, 2012, Singapore. (20 pages).
USPTO, Office Action from U.S. Appl. No. 13/057,881, dated Jun. 4, 2013, (13 pages).
"The Green 500 List—Nov. 2013," The Green 500, Nov. 20, 2013, (3 pages) [http://www.green500.org] (3 pages).
USPTO, Final Office Action from U.S. Appl. No. 13/057,881, dated Nov. 22, 2013 (13 pages).
People's Republic of China, Office Action issued in corresponding Chinese Application No. 200980131707.3 dated Dec. 20, 2013, incl. English Translation (8 pages).
USPTO, Applicant-Initiated Interview Summary from U.S. Appl. No. 13/057,881, dated Feb. 25, 2014 (4 pages).
USPTO, Office Action from U.S. Appl. No. 13/057,881, dated Apr. 11, 2014 (16 pages).
USPTO, International Search Report & Written Opinion, Application No. PCT/US2014/17835, dated Jun. 13, 2014 (9 pages).
USPTO, Applicant-Initiated Interview Summary from U.S. Appl. No. 13/057,881, dated Jul. 1, 2014 (3 pages).
USPTO, International Search Report & Written Opinion, Application No. PCT/US2014/037005, dated Sep. 24, 2014 (18 pages).
Lee, Si Young, et al., "Hydraulics and Mixing Evaluations for NT-21/41 Tanks," Oct. 2014 (32 pages).
USPTO, Applicant-Initiated Interview Summary from U.S. Appl. No. 13/057,881, dated Oct. 9, 2014 (3 pages).
USPTO, Final Office Action from U.S. Appl. No. 13/057,881, dated Nov. 3, 2014 (23 pages).
IP Australia, Notice of Acceptance, Australian Application No. 2009282170, dated Nov. 14, 2014 (2 pages).
USPTO, Office Action from U.S. Appl. No. 13/057,881, dated Jan. 9, 2015 (3 pages).
dated , Office Action from U.S. Appl. No. 13/057,881, dated Mar. 3, 2015 (20 pages).
"Intel Neon Processor E7-4800/8800 v3 Product Families", May 2015, p. 46 (1 page).
USPTO, Final Office Action in U.S. Appl. No. 13/057,881, dated Jun. 16, 2015, (30 Pages).
European Patent Office, Supplemental Search Report, European Application No. 12821634.8, dated Jul. 15, 2015 (6 pages).
USPTO, International Search Report & Written Opinion, Application No. PCT/US2015/30618, dated Aug. 5, 2015, (12 pages).
USPTO, Non-Final Office Action, U.S. Appl. No. 14/237,100, dated Sep. 30, 2015, (21 pages).
China National Intellectual Property Administration, Office Action, Chinese Application No. 201280049039.1, dated Oct. 27, 2015 (33 pages).
USPTO, International Search Report & Written Opinion, Application No. PCT/US2015/43468, dated Oct. 30, 2015 (11 pages).
Canadian Intellectual Property Office, Office Action, Canadian Application No. 2,731,994, dated Dec. 3, 2015 (6 pages).
USPTO, Non-final Office Action, U.S. Appl. No. 14/251,014, dated Dec. 4, 2015 (13 pages).
USPTO, Non-Final Office Action, U.S. Appl. No. 14/271,386, dated Dec. 17, 2015, (17 pages).
USPTO, Non-final Office Action, U.S. Appl. No. 14/245,978, dated Jan. 13, 2016 (33 pages).
Andre Bakker, "Modeling Flow Fields in Stirred Tanks," 2006, (40 pages).
Korean Intellectual Property Office, International Search Report and Written Opinion in International Application No. PCT/US2021/058991, dated Mar. 3, 2022 (10 pages).

* cited by examiner

DUAL COOLING TOWER TIME SHARE WATER TREATMENT SYSTEM

This application claims the benefit of U.S. Provisional Application No. 62/702,067, filed Jul. 23, 2018.

FIELD

The present invention is directed to cooling of electronic equipment.

BACKGROUND

In 2006, data centers in the United States (U.S.) accounted for about 1.5% (about $4.5 billion) of the total electricity consumed in the U.S. More than one-third of electricity consumed by data centers is not for the operation of the data servers and/or computer equipment, but rather for the operation of the cooling systems for the data servers and/or computer equipment. This electrical consumption equates to more than about 1% of all U.S. electricity consumed by 2011. While the hardware costs of data centers continue to decrease annually, the costs of electricity, personnel, and construction continue to increase annually. Due to their integral function and major electrical demands, the overall cost of the cooling operation is the largest and growing component of the total cost of operating a data center.

Typical commercially-available servers are designed for air cooling. Such servers usually comprise one or more printed circuit boards having a plurality of electrically coupled devices mounted thereto. These printed circuit boards are commonly housed in an enclosure having vents that allow external air to flow into the enclosure, as well as out of the enclosure after being routed through the enclosure for cooling purposes. In many instances, one or more fans are located within the enclosure to facilitate this airflow.

Commercially available methods of cooling have not kept pace with increasing server and data-center performance needs, or the corresponding growth in heat density. As a consequence, adding new servers to existing data centers is difficult and complex given the effort expended to facilitate additional power dissipation, such as by increasing an existing data center's air conditioning capacity.

Various alternative approaches for cooling data centers and their servers, e.g., using liquid cooling systems, have met with limited success. For example, attempts to displace heat from a microprocessor (or other heat-generating semiconductor-fabricated electronic device component, collectively referred to herein as a "chip") so as to remotely cool the chip have proven to be expensive and cumbersome. In these systems, a heat exchanger or other cooling device, has been placed in physical contact (or close physical relation using a thermal-interface material) with the package containing the chip. These liquid-cooled heat exchangers have typically defined internal flow channels for circulating a liquid internally of a heat exchanger body. However, component locations within servers can vary from server to server. Accordingly, these liquid-cooling systems have been designed for specific component layouts and have been unable to achieve large-enough economies of scale to become commercially viable.

SUMMARY

An embodiment is drawn to a method of operating a cooling system including at least two water cooling circuits, an analyzer/controller configured to analyze water in the at least two water cooling circuits and solenoid valves operably connected to the at least two water cooling circuits. The method comprising opening solenoid valves associated with a first water cooling circuit of the at least two water cooling circuits to allow cooling water to flow to the analyzer/controller, detecting if the cooling water comprises one or more impurities above one or more predetermined thresholds and treating the cooling water if the analyzer/cooler detects one or more impurities in the cooling water above one or more predetermined thresholds.

Another embodiment is drawn to cooling system including at least two water cooling circuits, an analyzer/controller configured to analyze water in the at least two water cooling circuits and solenoid valves operably connected to the at least two water cooling circuits. The cooling system is configured such that opening solenoid valves associated with a first water cooling circuit of the at least two water cooling circuits allows cooling water to flow to the analyzer/controller and the cooling water to be treated if the analyzer/cooler detects one or more impurities in the cooling water above one or more predetermined thresholds.

DETAILED DESCRIPTION

In an approach to liquid cooling systems, the immersion cooling system is located within shipping containers to facilitate transport of the cooling system. Typically, heat rejection from the datacenter is accomplished outside of the shipping container via evaporative cooling towers, which are the most energy efficient means to cool the computer equipment. However, water within the cooling tower loop can pose significant risk to the cooling system as corrosion and scaling of plumbing and heat exchangers can occur. Further, there is risk of health issues due to the possibility diseases that may exist or are promoted in warm water environments.

Figure 1:
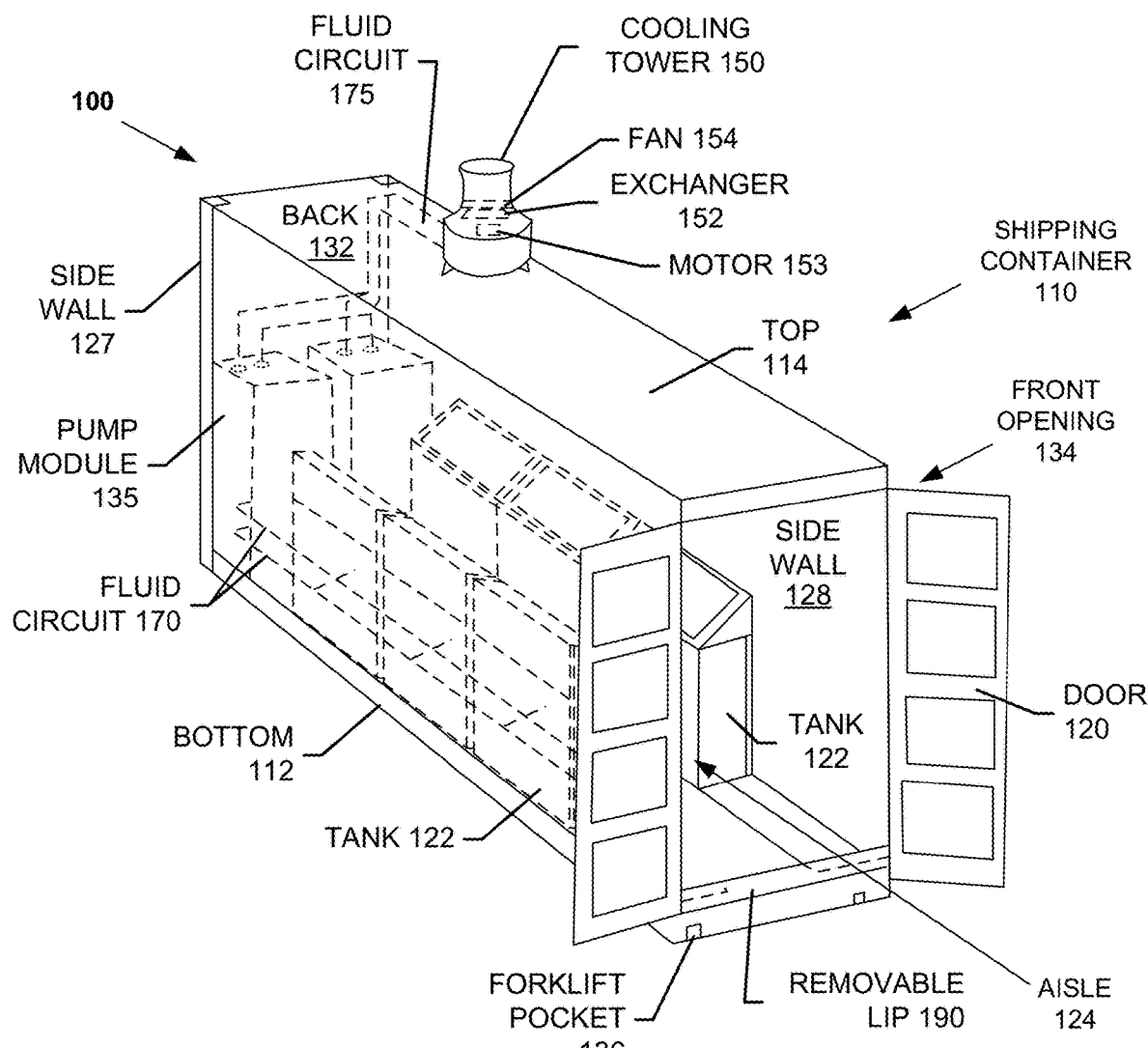
FIG. 1 is a perspective cut-away illustration of a conventional shipping container cooling system.

FIG. 1 illustrates a typical conventional transportable immersion cooling system 100 located within a portable container, such as a shipping container 110. The shipping container 110 has a back wall 132, opposing side walls 127 and 128, a bottom wall 112, a top wall 114 and a front opening 134. The front opening 134 is typically provided with a door(s) 120. Inside shipping container 110, a plurality of tanks 122 are provided, each tank 122 containing vertically mounted, independently removable and replaceable electronic components, such as data processing modules, hard drives etc.

In one conventional transportable immersion cooling system 100, the system 100 includes two rows of tanks 122 located adjacent the sidewalls 127, 128 of the shipping container 110. The two rows of tanks 122 are separated from each other by an aisle 124 which allows access to the tanks 122. The shipping container 110 may also be provided with a forklift pocket located at the bottom of the shipping container to aid in loading and unloading the shipping container onto a truck, train bed or ship as desired.

The conventional transportable immersion cooling system 100 also includes pump/heat exchanger modules 135, which each include a liquid-to-liquid heat exchanger configured to cool the dielectric coolant from the tanks 122 via first fluid circuits 170 with water from the cooling tower 150 via a second fluid circuit 175. Hot dielectric coolant from the tanks 122 is directed to the pump/heat exchanger modules 135, which is then cooled by the cooling water from the cooling tower 150 located on top of the shipping container 110 via the second fluid circuit 175. The cooling tower 150 includes an evaporative heat exchanger 152 and a motor 153 driven fan 154 for forcing air flow through the evaporative heat exchanger 152. The conventional transportable immersion cooling system 100 may also include a removable lip 190 which is configured to keep any spilled coolant or coolant that may have leaked from the tanks 122 inside the shipping container 110.

In an alternative conventional transportable immersion cooling system 100, the evaporative heat exchanger 152 is replaced with a liquid-liquid heat exchanger. In an example, the liquid-liquid heat exchanger may be connected to a water line which provides cooling water to the liquid-liquid heat exchanger. Otherwise, in the pump/heat exchanger modules 135, the cooling water can extract heat from the hot dielectric coolant provided from the tanks 122.

However, the conventional transportable immersion cooling system 100 does not include any water treatment elements. That is, the convention transportable immersion cooling system 100 does not include any elements that provide the ability to treat liquid coolant (e.g., water) for metals which can form a scale in the plumbing or biological which can foul the plumbing. It would be desirable to have a cost efficient water treatment system to mitigate water concerns in a water cooled immersion cooling system.

Figure 2:
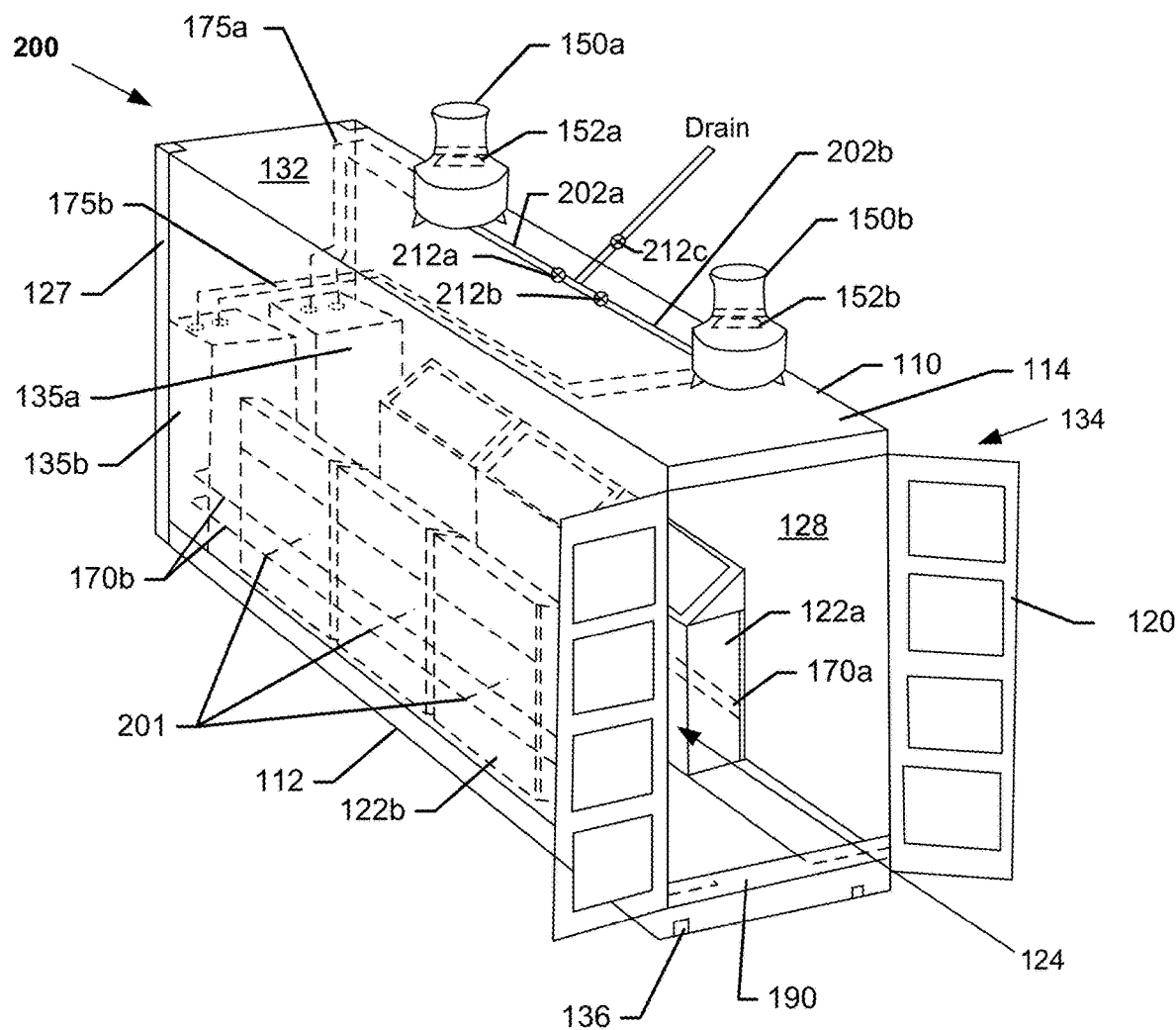
FIG. 2 is a perspective cut-away illustration of a cooling system according to an embodiment.
Figure 3:
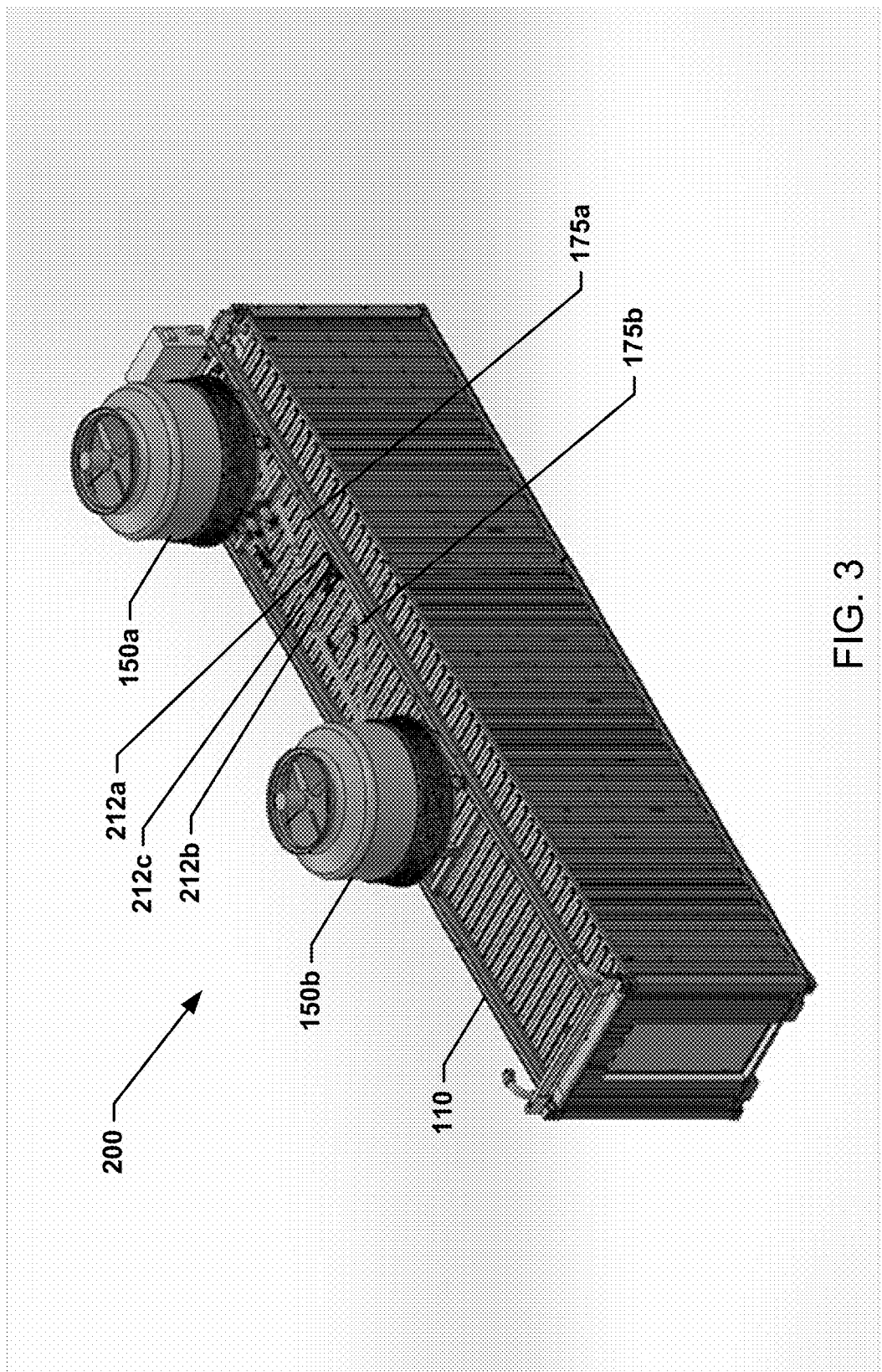
FIG. 3 is a perspective view of a portion of a cooling system according to an embodiment.
Figure 4:
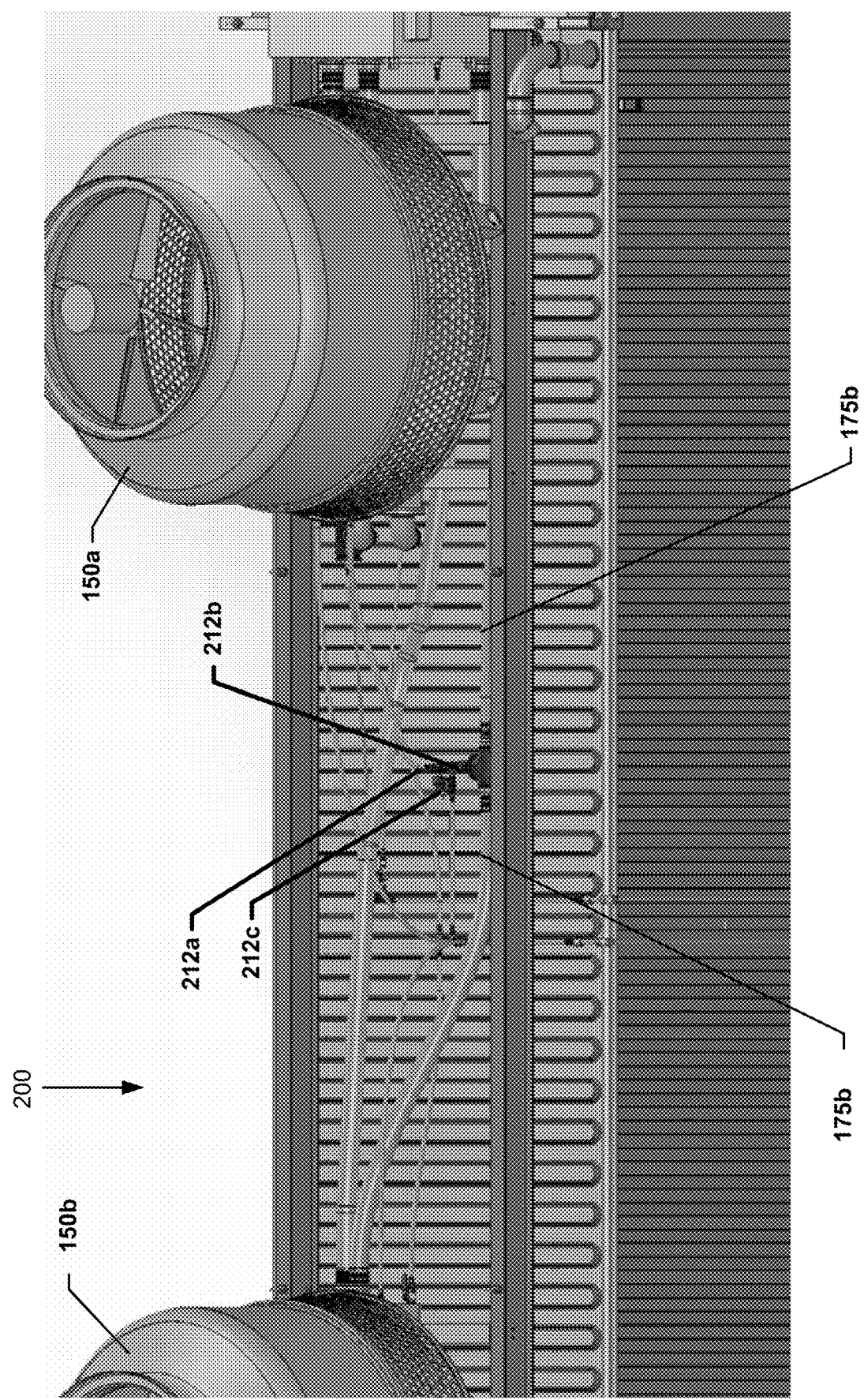
FIG. 4 is a perspective close-up view of the cooling system of FIG. 2.

FIGS. 2-4 illustrate a modular cooling system 200 according to an embodiment. As shown in FIG. 2, in this embodiment system, the cooling system 200 includes six cooling tanks 122a, 122b located in a portable container, such as a shipping container 110. Each of the cooling tanks 122a, 122b may include racks (not shown) configured to hold electronic equipment, such as servers, hard drives, etc. However, any number of racks/tanks 122a, 122b may be located in the shipping container 110, depending of the size of the shipping container 110 and the tanks 122a, 122b. In an embodiment, the six tanks 122a, 122b are operatively configured on independent pump/heat exchanger loops. That is, each of the six tanks 122a, 122b may be independently supplied with dielectric coolant and the dielectric coolant independently removed from the each of the tanks 122a, 122b without effecting the supply or withdrawal of dielectric coolant from the other tanks 122a, 122b.

In addition, as illustrated in FIG. 2, a first three of the tanks 122a may be operatively configured on a first independent pump/heat exchanger circuit 170a, which circulates to and from a first pump/heat exchanger module 135a, while the other three tanks 122b may be operatively configured on a second independent pump/heat exchanger circuit 170b, which circulates to and from a second pump/heat exchanger module 135b.

Also illustrated in FIG. 2 are two cooling towers 150a, 150b located on the top wall 114 of the shipping container 110. In an embodiment, the cooling towers 150a, 150b include evaporative heat exchangers 152a, 152b. In contrast, the first and second pump/heat exchanger modules 135a, 135b use liquid-liquid cooling with a first and second liquid. The first liquid is the dielectric coolant used to cool the servers and other electronic equipment in the tanks 122a, 122b. The second liquid is typically water which may be supplied from the local municipality and then treatment chemicals applied. Cool water may be provided to the evaporative heat exchangers 152a, 152b via cooling water circuits 202a, 202b. In an embodiment, the cooling water circuits 202a, 202b are divided into a first cooling water circuit 202a which provides cooling water to the first evaporative heat exchanger 152a in the first cooling tower 150a and to a second cooling water circuit 202b which provides cooling water to the second evaporative heat exchanger 152b in the second cooling tower 150b.

Figure 5:
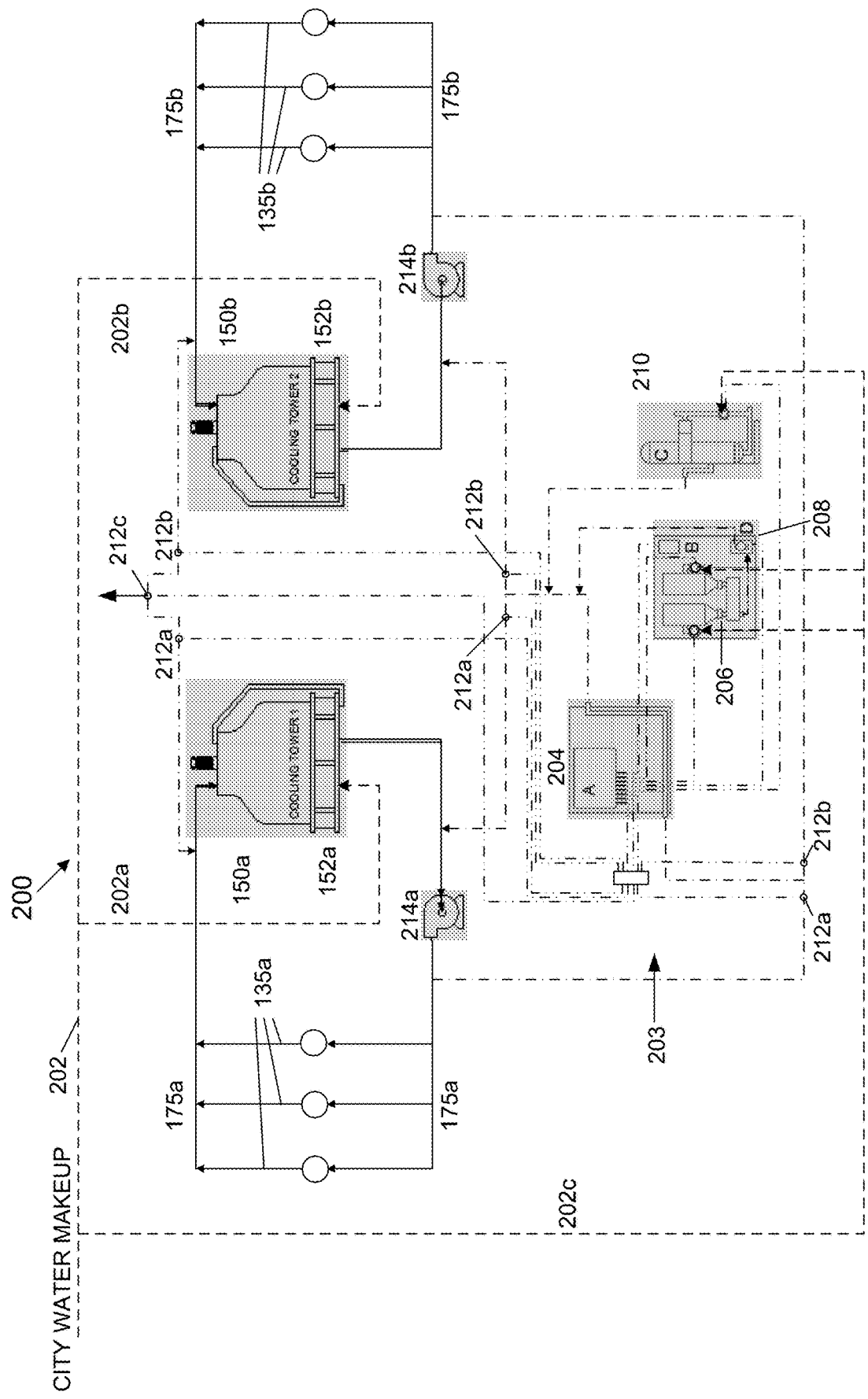
FIG. 5 is a schematic illustration of a cooling system according to an embodiment.

The modular cooling system 200 also includes a water treatment system 203, illustrated in FIG. 5, which includes a water treatment analyzer/controller 204, an inhibitor dispenser 206, an inhibiter feed pump 208, a biocide dispenser 210 and solenoid valves 212a, 212b, 212c. As discussed in more detail below the solenoid valves 212a, 212b, 212c may be used to shunt the cooling water from the cooling towers 150a, 150b to the water treatment system 203 for inhibitor and biocide treatment and then back to the cooling towers 150a, 150b after treatment.

As illustrated in FIG. 5, a first set of pump/heat exchanger modules 135a may be supplied with water via a first fluid supply circuit 175a with a first pump module 214a and a second set of pump/heat exchanger modules 135b supplied with water via a second fluid supply circuit 175b with a second pump module 214b. Heated water may be removed from the first set of pump/heat exchanger modules 135a and sent to the first cooling tower 150a to be cooled via the first fluid supply circuit 175a, while heated water from the second set of pump/heat exchanger modules 135b may be sent to the second cooling tower 150b to be cooled via the second fluid supply circuit 175b.

The first cooling tower 150a is provided with cooling water, typically from a municipal water line 202 via a first cooling water circuit 202a. The second cooling tower 150b is provided with cooling water, typically from a municipal water line 202 via a second cooling water circuit 202b. The first and second cooling towers 150a, 150b include a respective first evaporative heat exchanger 152a and second evaporative heat exchanger 152b.

As shown in FIG. 5, three of the pump/heat exchanger modules 135a, 135b on one side share water heat exchange on the first cooling water circuit 202a. The other three pump/heat exchanger modules 135a, 135b share water heat exchange on the second cooling water circuit 202b. In addition, the modular cooling system 200 includes a third cooling water circuit 202c. Operatively located on the third cooling water circuit 202c is the water treatment system 203. The water treatment system 203 may include an inhibitor dispenser 206 and an inhibitor feed pump 208. The inhibitor dispenser 206 provides chemicals which reduce the formation of scale in the plumbing of the modular cooling system 200. In addition, the water treatment system 203 may include a biocide dispenser 210. The biocide dispenser 210 is configured to provide one or more chemicals which destroy, deter, render harmless, or exert a controlling effect on harmful biological organisms in the water from the cooling water system, such as bacteria, algae and other biological organisms which may clog the various cooling water circuits 202, 202a, 202b, 202c, if left unchecked. Sampling and control of the water treatment system 203 is managed by a water treatment analyzer/controller 204.

In an embodiment, to address space constraints in the container (e.g., 110), the water treatment system 200 utilizes solenoid valves 212a, 212b to divert water from the first and second water cooling circuits 202a, 202b for a given time period, i.e. water treatment period. During this time period, the water treatment analyzer/controller 204 samples the water for pH, conductivity and bio-hazard materials. Based on the analysis of the water, the water treatment system 203 treats the water to rectify potentially hazardous conditions via the use of chemical treatment, biocide treatment or water blow-down. Water blow-down may use a water blow-down solenoid valve 212c that may be actuated to purge the water into a drain, which may be performed if a large amount of minerals or metals are found in the water. Water blow-down allows for the modular water cooling system 200 to be replenished with fresh water, rather than merely treating the existing water.

In an embodiment, once the treatment period is completed for the first water cooling circuit 202a, the water treatment analyzer/controller 204 closes first solenoid valves 212a for the first water cooling circuit 202a. Then, the water treatment analyzer/controller 204 opens second solenoid valves 212b for the second water cooling circuit 202b and completes the sampling and mitigation steps for the second water cooling circuit 202b. The water treatment analyzer/controller 204 can automatically switch back and forth between the first and second water cooling circuits 202a, 202b.

FIGS. 3 and 4 illustrate a portion of a cooling system according to an embodiment. In the embodiment illustrated in FIGS. 3 and 4, solenoid and water blow-down valves 212a, 212b, 212c and plumbing are constructed outside of the shipping container 110 to minimize water plumbing within the interior of modular cooling system 200. The solenoid and water blow-down valves 212a, 212b, 212c and plumbing are constructed outside of the shipping container 110 because plumbing breaks and leaks within the interior of the modular cooling system 200 can be very detrimental to the modular cooling system 200. A single fresh city water input line is introduced into the shipping container 110 to supply fresh water to the water treatment system (e.g., 203) to improve efficiency of the water treatment system 203. This minimizes water plumbing ingress points to the shipping container 110.

Figure 6:
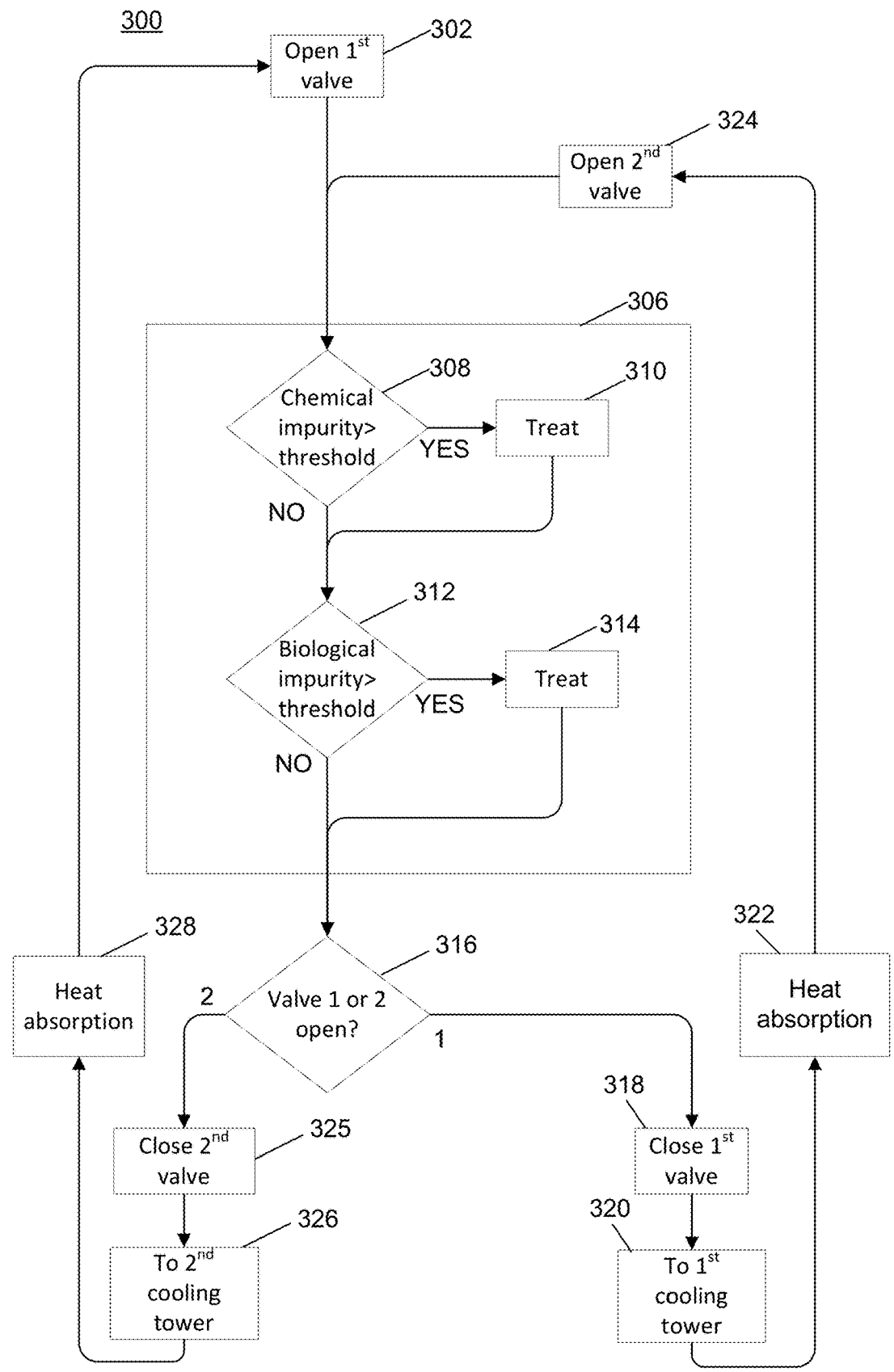
FIG. 6 is a flow chart illustrating a method of operating a cooling system according to an embodiment.

FIG. 6 is a flow chart illustrating a method 300 of operating a modular cooling system 200 according to an embodiment. Specifically, FIG. 6 illustrates an embodiment drawn to a method 300 of operating a cooling system 200 including at least two water cooling circuits 202a, 202b, an analyzer/controller 204 configured to analyze water in the at least two water cooling circuits 202a, 202b and the first and second solenoid valves 212a, 212b operably connected to the at least two water cooling circuits 202a, 202b. The method 300 comprises a step 302 of opening first solenoid valves 212a associated with a first water cooling circuit 202a of the at least two water cooling circuits 202a, 202b to allow cooling water to flow to the analyzer/controller 204 and a step 306 of detecting if the cooling water comprises one or more impurities. As part of step 306, in determination step 308 the analyzer/controller 204 determines whether a chemical impurity in the cooling water is above a predetermined threshold. Specifically, in an embodiment in determination step 308, the analyzer/controller 204 determines whether particular chemicals are detected in the cooling water above a predetermined threshold, e.g., scale forming chemicals. In response to the analyzer/controller 204 determining that the chemical impurity is above the predetermined threshold (i.e., determination step 308="YES")(e.g., the concentration of the chemical species is above the threshold), the inhibitor dispenser 206 may treat the cooling water with a chemical in step 310. In response to the analyzer/controller 204 determining that the chemical impurity is equal to or below the predetermined threshold (i.e., determination step 308="NO")(e.g., the chemicals detected in the cooling water are below the predetermined threshold), in determination step 312 the analyzer/controller 204 may determine whether the cooling water includes any biological impurity above a predetermined threshold (e.g., the concentration of a biological species are above the predetermined threshold). In response to the analyzer/controller 204 determining that the biological impurity is above the predetermined threshold (i.e., determination step 312="YES"), the biocide dispenser 210 treats the cooling water with one or more biocides in step 314. In response to the analyzer/controller 204 determining that the biological impurity is equal to or below the predetermined threshold (i.e., determination step 312="NO")(e.g., the concentration of the biological species is below the predetermined threshold), in determination step 316 the analyzer/controller 204 determines which valve is open. In an embodiment, the determination step 312 of determining whether the biological impurities are above the predetermined threshold may be performed prior to the determination step 308 of determining whether the chemical impurities are above the predetermined threshold.

In response to the analyzer/controller 204 in determination step 316 determining that the first solenoid valves 212a are open (i.e., determination step 316="1"), the analyzer/controller 204 will close the first solenoid valves 212a in step 318. When the first solenoid valves 212a are closed, such as from step 318, the cooling water is sent to the first evaporative heat exchanger 152a in the first cooling tower 150a in step 320. In step 322, heated water from the first set of pump/heat exchanger modules 135a, which is operably connected to the first fluid supply circuit 175a is also sent to the first evaporative heat exchanger 152a in the first cooling tower 150a to be cooled (i.e., "Heat absorption"). In this manner, the heated cooling water in the first water cooling circuit (e.g., 202a) may be once again cooled down and used to remove heat from the hot dielectric coolant from the first portion of the tanks 122a.

Second solenoid valves 212b, associated with the second cooling circuit 202b may then be opened in step 324, after which impurities may be detected in the water from the second cooling circuit 202b in step 306 before returning to determination step 316. Water in the second cooling circuit 202b is thus sent to the analyzer/controller 204 in step 306. Similar to the steps described above, in this way the concentration of chemicals and biologicals in the cooling water from the second cooling circuit 202b is analyzed for one or more impurities in step 306. In response to the analyzer/controller 204 in determination step 316 determining that the second solenoid valves 212b, associated with the second cooling circuit 202b, are open (i.e., determination step 316="2"), the analyzer/controller 204 will close the second solenoid valves 212b in step 325. When the second solenoid valves 212b are closed, such as from step 325, the cooling water from the second cooling circuit 202b is sent to the second evaporative heat exchanger 152b in the second cooling tower 150b in step 326. In step 328, heated water from the second set of pump/heat exchanger modules 135b, which is operably connected to the second fluid supply circuit 175b, is also sent to the second evaporative heat exchanger 152b in the second cooling tower 150b to be cooled (i.e., "Heat absorption").

As illustrated in FIG. 6, the method can be repeated as necessary after opening the first solenoid valves 212a in step 302 or opening the second solenoid valves 212b in step 324.

An embodiment is drawn to a cooling system 200 including at least two water cooling circuits 202a, 202b, an analyzer/controller 204 configured to analyze water in the at least two water cooling circuits 202a, 202b and solenoid valves 212a, 212b operably connected to the at least two water cooling circuits 202a, 202b. The cooling system 200 is configured such that opening solenoid valves 212a associated with a first water cooling circuit 202a of the at least two water cooling circuits 202a, 202b allows cooling water to flow to the analyzer/controller 204 and the cooling water to be treated if the analyzer/controller 204 detects one or more impurities in the cooling water above one or more predetermined thresholds 306.

In an embodiment, the cooling system 200 is configured such that when the first solenoid valves 212a associated with the first water cooling circuit 202a are closed, cooling water flows to a first cooling tower 150a. In an embodiment, the first cooling tower 150a comprises a first evaporative heat exchanger 152a and the first cooling tower 150a is located on top of a shipping container 110. In an embodiment, the cooling system 200 further comprises an inhibitor dispenser 206 configured to dispense de-scaling chemicals into the cooling water and a biocide dispenser 210 configured to dispense a biocide into the cooling water.

In an embodiment, the analyzer/controller 204, the inhibiter dispenser 206 and the biocide dispenser 210 are located inside a shipping container 110. In an embodiment, the cooling system 200 further comprises a plurality of tanks 122a, 122b located in the shipping container 110, the plurality of tanks 122a, 122b containing electronic equipment and a dielectric fluid, wherein hot dielectric fluid from a first set of the plurality of tanks 122a is provided to a first pump/heat exchanger module 135a to be cooled by the cooling water from the first water cooling circuit 202a. In an embodiment, second solenoid valves 212b associated with a second water cooling circuit 202b of the at least two water cooling circuits 202a, 202b are closed when the first solenoid valves 212a associated with the first cooling water circuit 202a are open. In an embodiment, the second solenoid valves 212b associated with the second water cooling circuit 202b may be opened when the first solenoid valves 212a associated with first cooling water circuit 202a are closed.

In an embodiment, the cooling system 200 further comprises a second cooling tower 150b located on top to the shipping container 110, the second cooling tower 150b comprising a second evaporative heat exchanger 152b and a second set of the plurality of tanks 122b located in the shipping container 110, the second set of the plurality of tanks 122b also containing electronic equipment and a dielectric fluid, wherein hot dielectric fluid from the second set of the plurality of tanks 122b is provided to a second pump/heat exchanger module 135b to be cooled by the cooling water from the second water cooling circuit 202b.

Although the foregoing refers to particular preferred embodiments, it will be understood that the invention is not so limited. It will occur to those of ordinary skill in the art that various modifications may be made to the disclosed embodiments and that such modifications are intended to be within the scope of the invention. All of the publications, patent applications and patents cited herein are incorporated herein by reference in their entirety.

What is claimed is:

1. A method of operating a cooling system comprising:
   opening first solenoid valves associated with a first water cooling circuit of at least two water cooling circuits to allow cooling water from the first water cooling circuit to be analyzed for impurities by an analyzer configured to separately analyze cooling water in each of the at least two water cooling circuits for impurities;
   detecting, by the analyzer, whether the cooling water from the first water cooling circuit comprises one or more impurities above one or more predetermined thresholds; and
   in response to detecting that the analyzed cooling water from the first water cooling circuit comprises the one or more impurities above the one or more predetermined thresholds:
      treating the analyzed cooling water from the first water cooling circuit;
      closing the first solenoid valves associated with the first water cooling circuit;
      opening second solenoid valves associated with a second water cooling circuit of the at least two water cooling circuits to allow the cooling water from the second water cooling circuit to be analyzed for impurities by the analyzer;
      detecting, by the analyzer, whether the cooling water from the second water cooling circuit comprises one or more impurities above the one or more predetermined thresholds; and
      treating the analyzed cooling water from the second water cooling circuit in response to the analyzer detecting that the analyzed cooling water from the second water cooling circuit comprises one or more impurities above the one or more predetermined thresholds.

2. The method of claim 1, wherein treating the cooling water comprises at least one of dispensing de-scaling chemicals into the cooling water or dispensing a biocide into the cooling water.

3. The method of claim 2, wherein treating the cooling water comprises dispensing the de-scaling chemicals into the cooling water and dispensing the biocide into the cooling water.

4. The method of claim 1, further comprising directing the cooling water from the first water cooling circuit to a first cooling tower located on top of a shipping container in response to closing the first solenoid valves, the first cooling tower comprising a first heat exchanger.

5. The method of claim 4, further comprising:
   detecting whether the cooling water from the second cooling circuit comprises one or more impurities above the one or more predetermined thresholds in response to opening the second solenoid valves; and
   in response to detecting that the cooling water from the second cooling circuit comprises the one or more impurities above the one or more predetermined thresholds:
      treating the cooling water from the second cooling circuit;
      closing the second solenoid valves associated with the second water cooling circuit; and
      directing the cooling water from the second water cooling circuit to a second cooling tower located on top of the shipping container, the second cooling tower comprising a second heat exchanger.

6. The method of claim 4, further comprising directing hot dielectric fluid from a first set of tanks located in the shipping container to the first cooling tower to be cooled by the cooling water from the first water cooling circuit.

7. The method of claim 6, further comprising directing hot dielectric fluid from a second set of tanks located in the shipping container to the second cooling tower to be cooled by the cooling water from the second water cooling circuit.

8. A cooling system comprising:
   at least two water cooling circuits;
   an analyzer configured to separately analyze cooling water in each of the at least two water cooling circuits for impurities;
   first solenoid valves operably connected to a first water cooling circuit of the at least two water cooling circuits; and
   second solenoid valves operably connected to a second water cooling circuit of the at least two water cooling circuits,
   wherein opening the first solenoid valves associated with the first water cooling circuit of the at least two water cooling circuits allows the cooling water from the first water cooling circuit to be treated in response to the analyzer detecting that the analyzed cooling water from the first water cooling circuit comprises one or more impurities above one or more predetermined thresholds, and
   wherein opening the second solenoid valves associated with the second water cooling circuit of the at least two water cooling circuits allows the cooling water from the second water cooling circuit to be treated in response to the analyzer detecting that the analyzed cooling water from the second water cooling circuit comprises one or more impurities above the one or more predetermined thresholds.

9. The cooling system of claim 8, wherein the cooling system is configured such that in response to the first solenoid valves associated with the first water cooling circuit being closed, the cooling water from the first cooling circuit flows to a first cooling tower.

10. The cooling system of claim 9, wherein the first cooling tower comprises a first heat exchanger and the first cooling tower is located on top of a shipping container.

11. The cooling system of claim 10, further comprising an inhibitor dispenser and a biocide dispenser, wherein as part of treating the analyzed cooling water at least one of the inhibitor dispenser dispenses de-scaling chemicals into the cooling water from the first water cooling circuit or the biocide dispenser dispenses a biocide into the cooling water from the first water cooling circuit.

12. The cooling system of claim 11, wherein the analyzer, the inhibiter dispenser and the biocide dispenser are located inside the shipping container.

13. The cooling system of claim 12, further comprising a plurality of tanks located in the shipping container, wherein the plurality of tanks contain electronic equipment and a dielectric fluid, wherein the dielectric fluid from a first set of the plurality of tanks is provided to the first cooling tower to be cooled by the cooling water in the first water cooling circuit.

14. The cooling system of claim 13, wherein the second solenoid valves associated with the second water cooling circuit of the at least two water cooling circuits are closed in response to the first solenoid valves associated with the first water cooling circuit opening.

15. The cooling system of claim 14, wherein the second solenoid valves associated with the second water cooling circuit are configured to be opened in response to the first solenoid valves associated with first cooling water circuit closing.

16. The cooling system of claim 14, wherein the cooling system further comprises:
   a second cooling tower located on top to the shipping container, the second cooling tower comprising a second heat exchanger,
   wherein the dielectric fluid from a second set of the plurality of tanks is provided to the second cooling tower to be cooled by the cooling water in the second water cooling circuit.

* * * * *